United States Patent
Hansen et al.

(10) Patent No.: US 10,101,672 B2
(45) Date of Patent: Oct. 16, 2018

(54) DEVICE FOR TREATING A DISC-SHAPED SUBSTRATE AND SUPPORT ADAPTER

(71) Applicant: SUSS MicroTec Lithography GmbH, Garching (DE)

(72) Inventors: Sven Hansen, Garching (DE); Henrik Petry, Garching (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 167 days.

(21) Appl. No.: 15/166,431

(22) Filed: May 27, 2016

(65) Prior Publication Data
US 2016/0370715 A1    Dec. 22, 2016

(30) Foreign Application Priority Data
May 27, 2015   (NL) .................................... 2014864

(51) Int. Cl.
*G03F 7/20* (2006.01)
*H01L 21/68* (2006.01)

(52) U.S. Cl.
CPC ........ *G03F 7/70733* (2013.01); *H01L 21/682* (2013.01)

(58) Field of Classification Search
CPC ... G03F 7/70733; G03F 7/7035; H01L 21/682
See application file for complete search history.

(56) References Cited

U.S. PATENT DOCUMENTS

| | | | | |
|---|---|---|---|---|
| 3,858,978 A | * | 1/1975 | Johannsmeier | G03F 7/70691 279/3 |
| 3,912,844 A | | 10/1975 | Endo et al. | |
| 5,888,682 A | * | 3/1999 | Nakasuji | B82Y 10/00 430/22 |
| 2006/0209288 A1 | | 9/2006 | Lee et al. | |
| 2012/0037819 A1 | | 2/2012 | Heumuller et al. | |
| 2013/0183627 A1 | | 7/2013 | Shibazaki | |
| 2014/0218707 A1 | | 8/2014 | Shibazaki | |
| 2015/0024147 A1 | | 1/2015 | Lee et al. | |

FOREIGN PATENT DOCUMENTS

| | | |
|---|---|---|
| DE | 102005005124 A1 | 8/2006 |
| JP | H11060624 A | 3/1998 |
| JP | 2003131387 A | 5/2003 |
| WO | 2012/081234 A1 | 6/2012 |
| WO | 2012173692 A1 | 12/2012 |

\* cited by examiner

*Primary Examiner* — Steven H Whitesell Gordon
(74) *Attorney, Agent, or Firm* — Hayes Soloway PC

(57) ABSTRACT

A device for treating a disc-shaped substrate is disclosed, comprising a support which has a support face for the disc-shaped substrate and a support adapter which can be coupled to the support and can support a mask used for treating the disc-shaped substrate, wherein an interface is provided which detects the coupling of the support adapter to the support and wherein a control system is provided which cooperates with the interface and detects whether the support adapter is coupled to the support, in particular whether the interface is occupied. A support adapter for use in a device of this type is further disclosed.

21 Claims, 4 Drawing Sheets

DEVICE FOR TREATING A DISC-SHAPED SUBSTRATE AND SUPPORT ADAPTER

The invention relates to a device for treating a disc-shaped substrate and to a support adapter for use in a device of this type.

BACKGROUND OF THE INVENTION

Devices for treating a disc-shaped substrate which are used in connection with photolithography methods are known in the art. By a photolithography method, microstructured components can be produced, for example integrated circuits, semiconductor chips or microelectromechanical systems (MEMSs). In the production method, a mask is initially loaded into the device. Afterwards, a substrate ("wafer") is coated with a photoresist ("resist") and subsequently illuminated through the mask. The illumination changes the physical and/or chemical properties of the photoresist applied to the substrate partially. Subsequently, the photoresist can be removed in regions defined by the mask. The treated substrate can subsequently be processed further.

The mask used for producing the microstructured component is loaded into the device by positioning it in the device using a support ("chuck"). The support is typically orientated exactly towards the mask to ensure that the mask is introduced into the device in a predefined position. A support of this type is also known as a mask-loading support. Within the device, at least one holding means is provided, which can receive the mask from the support and hold it in such a way that the mask is loaded by the device. Subsequently, the (coated) substrate is laid in the device, another support suitable for supporting the substrate initially having to be installed in the device for this purpose. A support of this type is known as a process support.

It has been found to be disadvantageous that when different microstructured components are produced using different masks the support has to be changed every time a new mask is to be loaded.

The object of the invention is to provide an option by means of which different microstructured components can be produced efficiently.

BRIEF DESCRIPTION OF THE INVENTION

The object is achieved according to the invention by a device for treating a disc-shaped substrate, comprising a support which has a support face for the disc-shaped substrate, and a support adapter which can be coupled to the support and can support a mask used for treating the disc-shaped substrate, an interface being provided which detects the coupling of the support adapter to the support, and a control system being provided which cooperates with the interface and detects whether the support adapter is coupled to the support, in particular whether the interface is occupied.

The idea underlying the invention is to provide a support adapter which can cooperate with the support in such a way that the same support can be used for supporting the substrate and for supporting the respective mask. As a result, the efficiency can be increased since the supports need not necessarily be changed when another mask is to be loaded. Instead, the support adapter can be placed on and coupled to the support in a simple manner, and time is saved as a result. Via the interface, the control system detects whether the support adapter is actually coupled to the support. The control system thus indirectly receives the information as to whether a substrate or a mask is arranged on the support.

A single support can be used which supports a substrate and on which a support adapter can be loaded in order to carry a mask. The loaded support adapter lays at the designated position on the support such that a mask can be loaded on the loaded and fixedly positioned support adapter.

It is determined via the interface and the control whether a support adapter is loaded on the support or not. Thus, it can be detected which mask can be loaded on the support and the support adapter loaded on the support, respectively. This means that the interface detects whether the support adapter is loaded on the support or not before the loading process of the mask is initiated.

In particular, the interface is an electromechanical interface. An electromechanical element is provided at the support and/or the support adapter wherein the electromechanical element is part of the interface and used for detection. The electromechanical element can be a mechanical element which state is analyzed electronically.

The interface and the control are generally formed such that a support adapter loaded on the support is detectable. It is not detected by the interface if a mask is loaded whether on the support or on the support adapter coupled to the support. The loading process of the mask does not take place before it has been checked via the interface if a support adapter is arranged on the support or not.

The support is a support typically used in the device when the substrate is being treated. This support is referred to in the following as a process support.

In one aspect, the support adapter codes the support via the interface, in particular in such a way that the control system accesses another program in a software. As a result of the coding of the interface, it is suggested to the software of the control system that a support which is provided for supporting the mask is installed, in other words a mask-loading support. The control system thus detects on the basis of the coded interface that a mask is arranged on the support, and as a result the control system can initiate typical program sequences which are provided when a mask is to be unloaded or loaded.

In a further aspect, the control system is coupled to a memory or comprises a memory in which values of the support and of the support adapter are stored, in particular the weight and/or the dimensions. As a result, the control system can access the relevant data which are important so as to be able to precisely control the processes running in the device. The control device can thus establish at what height the mask is positioned on the support with the support adapter arranged in between, ensuring for example that the mask is not being damaged during loading.

Further, at least one radiation source and/or one holding means which can hold the mask may be provided. When the mask is loaded, the holding means takes up the mask, which is arranged on the support and the support adapter, in such a way that the support adapter can subsequently be extended so as to arrange the support adapter on the same support. By way of the at least one radiation source, the substrate placed on the support can subsequently be illuminated with a radiation through the mask so as to produce the microstructured component.

As usual, the mask is transferred via the holding means, which can also be called positioning means, to the support and the support adapter (optionally) loaded on the support. The support adapter itself represents an intermediate module having a fixed position wherein the mask is loaded and positioned via the support adapter. Hence, the stationary support adapter distinguishes from a movable holding means which merely transfers the mask to the support and the support adapter, respectively.

In fact, the loading process of the mask is only initiated after it has been detected via the interface that a certain support adapter lays on the support and has been loaded, respectively, or that no support adapter is positioned on the support.

For instance, the support adapter is firstly loaded on the support which will then be detected by the interface. Thereupon, a sequence of the mask loading program is initiated in order to load an appropriate mask being suitable for the support adapter. In doing so, the mask is moved via the holding means while the mask reaches its predetermined position because of the support adapter. After the mask has reached its predetermined position, the support adapter is removed such that the substrate can be loaded on the support which substrate will be exposed to light through the mask loaded.

Hence, it is not necessary to dismount the adapter in order to load the mask and the substrate as just a single support is provided in contrast to the prior art. In the prior art, a process support and a mask-loading support were provided.

In particular, the control system actuates the radiation source and/or the holding means, preferably as a function of the status of the interface. If the support system detects that the interface is occupied, in other words that the support adapter is coupled to the support, the control system actuates the holding means in such a way that the holding means loads the mask located on the support adapter. If a mask is already loaded, it can also be arranged on the support adapter so as to unload the mask. If the interface is not coded and a mask is already loaded, the control system can actuate the radiation source in such a way that the substrate arranged on the support is irradiated. As a result of the interface being occupied, some of the programs stored in the control system can be accessible, whilst others of the stored programs are blocked. This applies conversely for an unoccupied interface.

In one embodiment, the interface comprises a first coding element on the support adapter and a second coding element on the support, which cooperate when the support adapter is coupled to the support so as to code the support. This provides coding of the support in a simple manner. The two coding elements are arranged on the support adapter and on the support in such a way that they cooperate in the coupled state.

In particular, the first coding element may be a coding pin and the second coding element may be a coding opening, the coding pin engaging in the coding opening when the support adapter is coupled to the support. The interface may thus comprise an electromechanical coding which is particularly simple to implement. Further, an electromechanical coding is less susceptible to faults than an electronic coding. The electromechanical coding can be implemented by a mechanical means which state is analyzed electronically.

In a further aspect, the support adapter is coupled to the support via a vacuum interface, the vacuum interface in particular being provided for fixing the disc-shaped substrate. Via the vacuum interface, the disc-shaped substrate is typically fixed to the support, in such a way that the substrate takes on a predefined position on the support. When the support is being coupled to the support adapter, this vacuum interface can be used for defined positioning of the support adapter on the support.

In corner regions, the support adapter further comprises holding portions via which the mask can be held using the support adapter, the holding portions in particular comprising suction faces at which a vacuum is applied. The mask can thus also be fixed to the support adapter in a defined position by vacuum. The vacuum may in particular be the vacuum via which the support adapter is fixed to the support. This means that a single vacuum source is sufficient to fix the mask to the support adapter, the support adapter to the support, and subsequently the substrate to the support in a predefined position. This generally ensures that the mask takes on a defined position with respect to the support.

A further aspect provides a prevention against rotation, which prevents rotation of the support adapter relative to the support. The rotation prevention ensures a defined position of the support adapter in the plane on the support. The mask can thus be loaded in the provided orientation.

In particular, the device comprises only a single attachment region for a support. The device for treating a disc-shaped substrate is thus a compact device which merely requires a small space. Nevertheless, different microstructured components can be produced efficiently.

The invention further relates to a support adapter for use in a device for treating a disc-shaped substrate of the aforementioned type, the support adapter comprising a coding element, in particular a coding pin. Using the support adapter, it can be ensured that a provided support, which is formed to receive a disc-shaped substrate, can be reconfigured in such a way that a mask can be arranged on this support. Further, the support adapter ensures that the support is coded, suggesting to the control system that the support installed in the device is a support for a mask.

BRIEF DESCRIPTION OF THE DRAWINGS

Further advantages and properties of the invention may be taken from the following descriptions and the drawings to which reference is made. In the drawings.

DETAILED DESCRIPTION OF THE INVENTION

Figure 1:
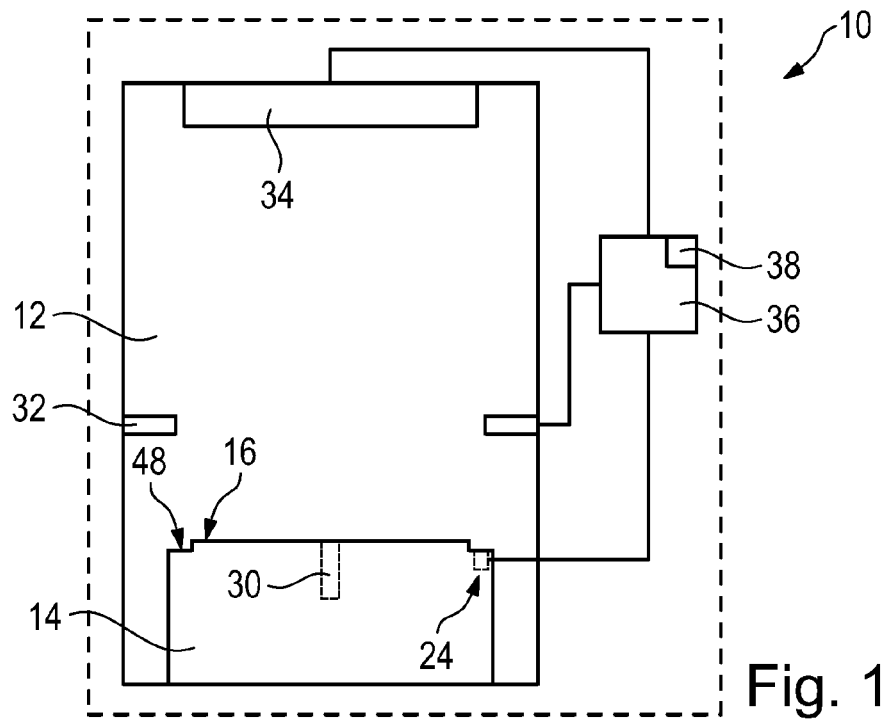
FIG. 1 is a schematic view of a device according to the invention for treating a disc-shaped substrate in a first process step.

FIGS. 1 to 4 show a device 10 for treating a disc-shaped substrate in various process steps during the production of a microstructured component.

The device 10 comprises a chamber 12 in which a support 14 is arranged, which has a support face 16 for a substrate 18 (see FIG. 4) which is formed substantially disc-shaped. The support 14 is thus a process support. As stated above, the process support is the support 14 which is typically arranged in the device 10 during the treatment of the substrate 18, in other words during the process.

Figure 2:
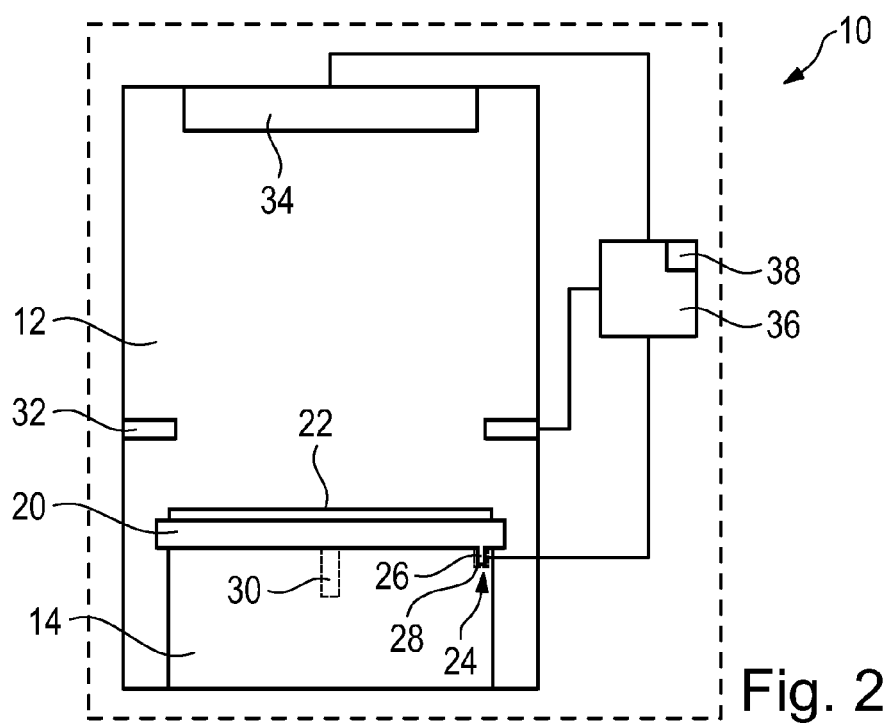
FIG. 2 shows the device according to the invention from FIG. 1 in a second process step.

A separately produced support adapter 20, shown in greater detail in FIGS. 5 to 8, can be coupled to the support 14 (see FIG. 2). The support adapter 20 may support a mask 22 which is used for treating the substrate 18, as is described further in the following.

The support 14 further comprises an interface 24 which is occupied when the support adapter 20 is coupled to the support 14 (see FIG. 2). For this purpose, the support adapter 20 comprises a first coding element 26. In the coupled state, the first coding element 26 cooperates with a second coding element 28 provided on the support 14.

Therefore, the interface 24 is an electromechanical interface.

In the embodiment shown, the first coding element 26 is formed as a coding pin and the second coding element 28 is formed as a coding opening, the coding pin engaging in the coding opening in the coupled state.

As a result of the cooperation of the two coding elements 26, 28, the support 14 is coded as is described further in the following.

Figure 4:
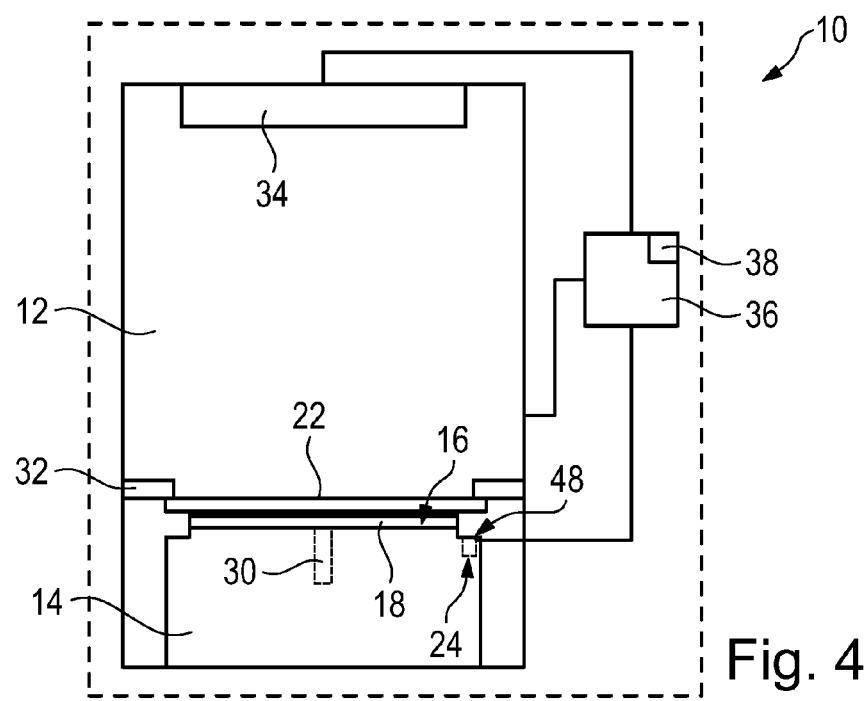
FIG. 4 shows the device according to the invention from FIGS. 1 to 3 in a fourth process step.

The support 14 additionally comprises a vacuum interface 30 via which the support 14 can fix the substrate 18 in a predefined position on the support 14 (see FIG. 4). The vacuum interface 30 further serves to fix the support adapter 20 on the support 14 in such a way that the support adapter 20 likewise has a predefined position with respect to the support 14 (see FIG. 2).

The device 10 additionally comprises at least one holding means 32 which is provided in particular movably within the chamber 12. By way of the holding means 32, the mask 22 can be removed from the support adapter 20 and held, as is described further in the following.

The device 10 further comprises a radiation source 34 which is used for treating the substrate. In the embodiment shown, the radiation source 34 is arranged in the chamber 12. Alternatively, the radiation source 34 may also be arranged outside the chamber 12, the radiation from the radiation source being coupled into the chamber 12.

A control system 36 is further provided and is coupled to the interface 24, the holding means 32 and the radiation source 34 in such a way that the control system 36 can actuate the holding means 32 and the radiation source 34. The actuation takes place in particular as a function of the information which the control system 36 receives from the interface 24.

In the embodiment shown, the control system 36 additionally comprises a memory 38 in which values for the support 14 and the support adapter 20 are being stored. Alternatively, the memory 38 may also be an external memory which is accessed by the control system 36.

FIGS. 5 to 8 show the support adapter 20 in detail.

Figure 5:
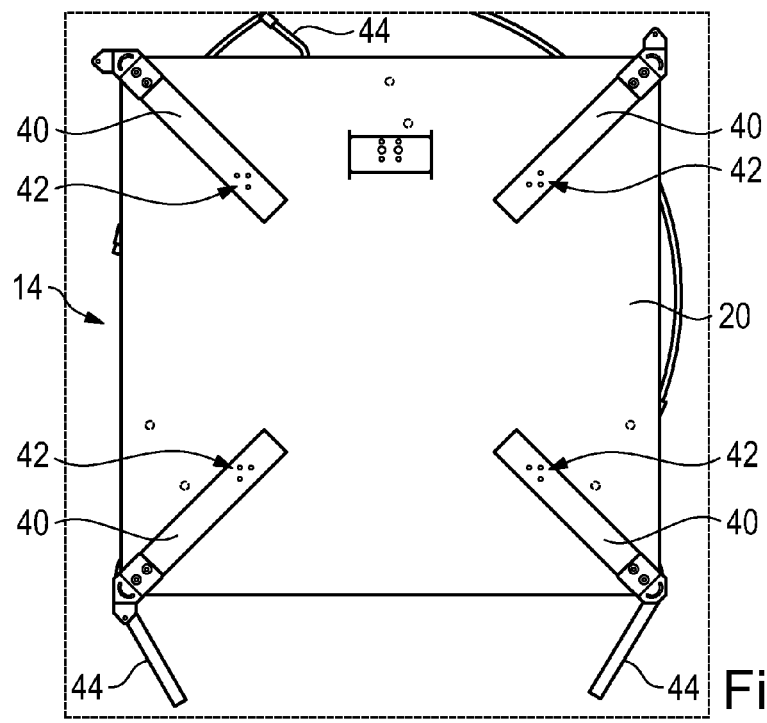
FIG. 5 shows a support adapter according to the invention which is arranged on a support.

FIG. 5 is a plan view of the support adapter 20 fixed to the support 14. The support adapter 20 comprises holding portions 40 by way of which the mask 22 can be fixed to the support adapter 20 in a predefined position.

The holding portions 40 are provided in the respective corners of the support adapter 20 which is formed substantially square and plate-shaped. In addition, the holding portions 40 comprise suction faces 42 by way of which the mask 22 is fixed to the support adapter 20. A vacuum is applied at the suction faces 42 for this purpose, and may be a vacuum which is also applied at the vacuum interface 30. There is thus a flow connection between the holing portions 40 and the vacuum interface 30, which is represented by tubes 44 in FIGS. 5 and 6.

Figure 6:
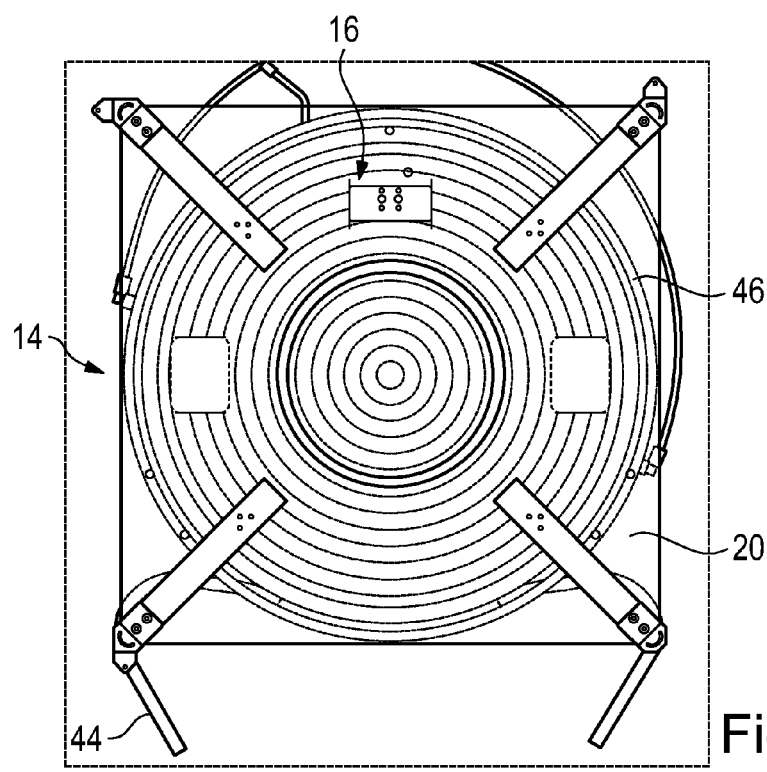
FIG. 6 is the drawing of FIG. 5, the support adapter being shown transparent.

The flow connection of the vacuum interface 30 to the holding portions 40 can be seen in particular from FIG. 6 which gives the same view as FIG. 5, but showing the support adapter 20 transparent in such a way that the substantially circular support face 16 of the support 14 can be seen.

Generally, in this embodiment one vacuum source is sufficient to ensure the fixing of the substrate 18 to the support 14, the fixing of the support adapter 20 to the support 14 and the fixing of the mask to the support adapter 20.

Figure 7:
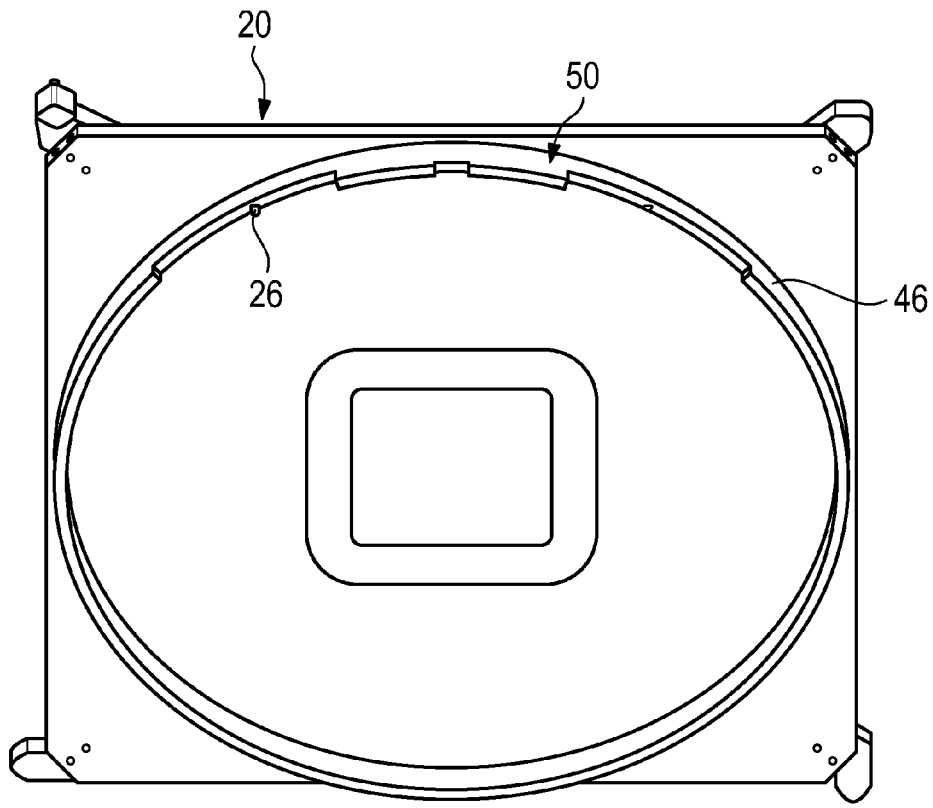
FIG. 7 is a perspective view of the support adapter from below.

FIG. 7 shows the support adapter 20 from below, on which a peripheral ring 46 protruding from the underside is provided, which is also shown in FIG. 6. The ring 46 encloses the outer edge of the support face 16 of the support 14, in such a way that the support adapter 20 can be arranged positioned correctly on the support 14.

Figure 8:
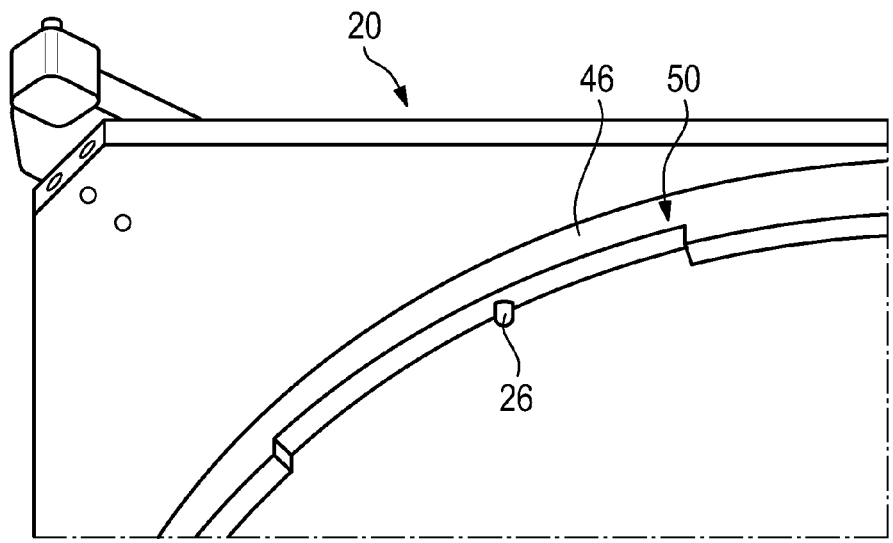
FIG. 8 is a detail from FIG. 7.

The ring 46 is positioned on the shoulder portion 48 of the support 14 (see FIGS. 1 and 2) on which the second coding element 28 is also provided. The first coding element 26, shown in detail in FIG. 8, is arranged on the ring 46.

The ring 46 further comprises a prevention 50 against unintended rotation, which is formed by way of the irregular contour of the ring element 46 via which the ring 46 cooperates with the shoulder portion 48. The mechanical rotation prevention 50 ensures that the support adapter 20 is not only arranged correctly on the support 14 with respect to the plane of the support face 16, but also arranged correctly about the axis of rotation of said face, in other words in the plane.

The following describes how the support adapter 20 is used to produce different microstructured components efficiently.

In the initial state shown in FIG. 1, the support 14 is installed in the device 10, which merely comprises a single attachment region for a support 14. The support 14 is the support 14 which is suitable for supporting the substrate 18, in other words a process support.

In the initial state, the device 10 has not yet loaded a mask. For this purpose, in the art, the support 14 is changed in a complex manner, and a mask-loading support is being installed. This is no longer necessary since the support adapter 20, which can support the mask 22, is arranged on the support 14 provided in the device 10, in other words the process support. The process support thus becomes a mask-loading support. This is shown in FIG. 2.

In this context, the support adapter 20 is fixed to the support 14 via the vacuum interface 14 and positioned via the ring 46 thereof on the shoulder region 48 of the support 14. Further, the mechanical rotation prevention 50 on the ring 46 cooperates with the support 14, in particular the shoulder region 48 thereof, in such a way that the support adapter 20 also cannot be rotated about an axis of rotation in the plane.

The mask 22 is also held on the support adapter 20 by means of a vacuum via the suction faces 42 of the holding portions 40 in such a way that the mask 22 is also fixed in a predefined position on the support adapter 20.

The vacuum interface 30, the mechanical anti-twist protection 50 and the holding portions 40 ensure that the mask 22 has a defined position with respect to the support 14. This is important so as to load the mask 22 reliably, and this takes place in the following step.

In the state shown in FIG. 2, the support adapter 20 codes the support 14 via the interface 24 in such a way that the control system 36 detects that the support 14 is coupled to the support adapter 20. As a result, a program of a software provided in the control system 36 is called, which may be referred to as a mask-loading program.

By way of the occupied interface 24, it is suggested to the control system 36 that the installed support 14 is a mask-loading support, causing the control system 36 to call the corresponding program. In this context, the control system 36 accesses the values stored in the memory 38.

The mask 22 is loaded in that the control system 36 displaces the holding means 32 so as to remove the mask 22 from the support adapter 20 and hold it. For this purpose, the holding means 32 may be provided with suction openings via which the mask 22 can be held on the holding means 32 by means of a vacuum.

The control system 36 thus actuates the holding means 32 in such a way that it just contacts the mask 22 arranged on the support adapter 20. For this purpose, values relating to the dimensions of the support 14 and the support adapter 20 are stored in the memory 38, and the control system 36 accesses them and calculates therefrom how far the holding means 32 can be displaced.

When the interface 24 is occupied, causing the support 14 to be correspondingly coded, the control system 36 generally actuates the components of the device 10 as if a support for the mask were installed in the device 10.

Figure 3:
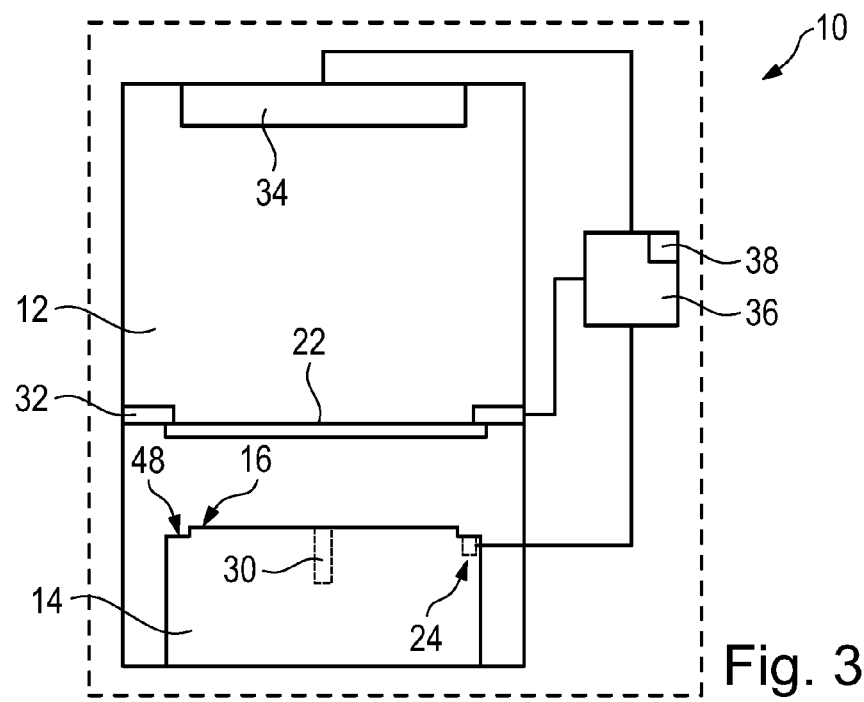
FIG. 3 shows the device according to the invention from FIGS. 1 and 2 in a third process step.

Once the mask 22 has been loaded, the support adapter 20 can be removed from the support 14 so as to prepare the support 14 for receiving the substrate 18. This state is shown in FIG. 3. There is therefore no need to change the support 14.

Since the extension of the support adapter 20, the interface 24 is no longer occupied, and the control system 36 accordingly detects this and switches to another program in the software, which may be referred to as a process program.

The substrate 18 can now be laid on the support face of the support 14 and fixed to the support 14 via the vacuum interface 30.

Subsequently, the mask 22 can be displaced by the holding means 32 again in such a way that it is brought directly above the substrate 18 or even into contact with the substrate 18. This is shown in FIG. 4.

Once the substrate 18 has been introduced into the chamber 12, the control system 30 can actuate the radiation source 34 so as to apply radiation to the substrate 18 through the mask 22. The treated substrate 18 can subsequently be processed further.

If another mask is now to be loaded, the produced microstructured component, in other words the processed substrate 18, can be removed from the device 10, and the support adapter 20 can be arranged on the support 14, causing the interface 24 to be occupied again. The control system 36 accordingly detects this in such a way that an unloading program can be called. Thereupon, the holding means 32 deposit the loaded mask 22 on the support adapter 20 in such a way that this mask 22 can be removed and a new mask can be laid in. Subsequently, the support adapter 20 can be removed from the support 14 and a new substrate can be laid on the support 14 so as to start the production of another microstructured component.

As a result, a new mask can be loaded efficiently since there is no need to change the support 14.

The very same support 14 can thus be used to support the substrate 18 as well as the mask 22, the mask 22 being arranged on the support 14 via the interposed support adapter 20.

The exact, predefined position of the mask 22 with respect to the support 14 is ensured via the vacuum interface 30, the mechanical rotation prevention 50 and the holding portions 40 comprising the suction faces 42. The holding means 32 can therefore receive and hold the mask 22 arranged on the support adapter 20 reliably, in such a way that the mask 22 can be loaded and subsequently unloaded reliably.

The invention claimed is:

1. Device for treating a disc-shaped substrate, comprising a support which has a support face for said disc-shaped substrate, and said device comprising a support adapter for being coupled to said support and for supporting a mask used for treating said disc-shaped substrate, said device comprising an interface for detecting the coupling of said support adapter to said support, and said device further comprising a control system which cooperates with said interface, and said control system is configured such that said control system detects whether said support adapter is coupled to said support.

2. Device according to claim 1, characterised in that said support adapter codes said support via said interface.

3. Device according to claim 2, characterised in that said support adapter codes said support via said interface in such a way that said control system accesses another program in a software.

4. Device according to claim 1, characterised in that said control system is coupled to a memory or said control system comprises a memory, and values of said support and of said support adapter are stored in said memory.

5. Device according to claim 4, characterised in that the weight and/or the dimensions of said support and of said support adapter are stored in said memory.

6. Device according to claim 1, characterised in that at least one radiation source is provided.

7. Device according to claim 6, characterised in that said control system actuates said radiation source.

8. Device according to claim 7, characterised in that said control system actuates said radiation source as a function of the status of said interface.

9. Device according to claim 1, characterised in that at least one holding means for holding said mask is provided.

10. Device according to claim 9, characterised in that said control system actuates said holding means.

11. Device according to claim 10, characterised in that said control system actuates said holding means as a function of the status of said interface.

12. Device according to claim 1, characterised in that said interface comprises a first coding element on said support adapter and a second coding element on said support, said first and second coding elements cooperate when said support adapter is coupled to said support so as to code said support.

13. Device according to claim 12, characterised in that said first coding element is a coding pin and said second coding element is a coding opening, and said coding pin engaging in said coding opening when said support adapter is coupled to said support.

14. Device according to claim 1, characterised in that said support adapter is coupled to said support via a vacuum interface.

15. Device according to claim 14, said vacuum interface is provided for fixing said disc-shaped substrate.

16. Device according to claim 1, characterised in that, in corner regions, said support adapter further comprises holding portions via which said mask can be held by said support adapter.

17. Device according to claim 16, said holding portions comprise suction faces at which a vacuum is applied.

18. Device according to claim 1, characterised in that a rotation prevention is provided for preventing rotation of said support adapter relative to said support.

19. Device according to claim 1, characterised in that said control system is configured such that said control system detects whether said interface is occupied.

20. Support adapter for use in a device for treating a disc-shaped substrate according to claim 1, wherein said support adapter comprises a coding element, in particular a coding pin, wherein the support adapter is configured to be coupled with a carrier.

21. A device for treating a disc-shaped substrate, comprising a support which has a support face for said disc-shaped substrate, and said device comprising a support adapter for being coupled to said support and for supporting a mask used for treating said disc-shaped substrate, said device comprising an interface for detecting the coupling of said support adapter to said support, and said device further comprising a control system which cooperates with said interface, and said control system is configured such that said control system detects whether said support adapter is coupled to said support, wherein at least one holding means for holding said mask is provided and wherein the support adapter and the holding means are separately formed.

* * * * *